United States Patent [19]

Protic et al.

[11] 4,415,916

[45] Nov. 15, 1983

[54] GERMANIUM SEMICONDUCTING RADIATION DETECTOR WITH PHOSPHORUS IMPLANTED N+ CONTACT

[75] Inventors: Davor Protic, Jülich; Georg Riepe, Mechernich, both of Fed. Rep. of Germany

[73] Assignee: Kernforschungsanlage Jülich GmbH, Jülich, Fed. Rep. of Germany

[21] Appl. No.: 160,232

[22] Filed: Jun. 17, 1980

[30] Foreign Application Priority Data

Jun. 19, 1979 [DE] Fed. Rep. of Germany ....... 2924569

[51] Int. Cl.³ ............................................ H01L 27/14
[52] U.S. Cl. ...................................... 357/29; 357/58; 357/91; 148/1.5
[58] Field of Search .......................... 357/29, 91, 58; 148/1.5

[56] References Cited

PUBLICATIONS

Herzer et al., *Nuclear Instruments and Methods*, 101 (1972), pp. 31–37.
Hubbard et al., *IEEE Trans. on Nuclear Science*, vol. NS-24, No. 1, Feb. 1977, pp. 161 et seq.
Hung et al., *IBM Tech. Discl. Bull.*, vol. 17, No. 5, Oct. 1974.

*Primary Examiner*—Martin H. Edlow
*Attorney, Agent, or Firm*—Frishauf, Holtz, Goodman & Woodward

[57] ABSTRACT

Germanium detectors usable for charged particle spectroscopy and capable of enduring overvoltage without impairment are produced by first implanting phosphorus ions of high energy in a small dose and then implanting more phosphorus ions of lower energy in a large dose. The low energy ions reduce surface resistance without impairing the improved properties of withstanding overvoltage that are provided by the high energy implantation. The p+ contact is provided by boron ion implantation in a conventional manner. "Dead zones" on both sides have been found to have a very small thickness of 0.3 μm.

9 Claims, 2 Drawing Figures

GERMANIUM SEMICONDUCTING RADIATION DETECTOR WITH PHOSPHORUS IMPLANTED N+ CONTACT

This invention relates to semiconductor detectors used for charged particle spectroscopy and similar purposes, made of germanium and having an n+ contact produced by phosphorus implantation in highly pure substrate material, followed by tempering, and particularly for large surface detectors of this nature.

Semiconductor detectors of highly pure germanium are known that are specially made with a p+ contact produced by boron implantation and an n+ contact produced by lithium diffused into the material, or by phosphorus implantation (See IEEE Trans.Nucl.Sci. NS-24 (1977) P.65 and P. 161, and also Nucl.Instr.Meth. 101 (1972) 31–37).

Since lithium has a considerable mobility in the semiconductor lattice, which is disadvantageous for application of the material to radiation detectors over long periods of time, the mainstream of development is concentrated on detectors with phosphorus implanted n+ contacts. Germanium semiconductor detectors were described by H. Herzer et al. (Nucl. and Meth. 101 (1972) 31–37) which were produced of highly pure germanium by boron implantation at $10^{14}/cm^2$ and 10–20 kV without tempering on one side, and by phosphorus implantation at $10^{14}/cm^2$ and 4 kV, followed by annealing at 300° C., on the other side. Phosphorus implantations with up to 30 kV at $10^{15}$ ions of phosphorus per $cm^2$ in n-germanium by Herzer et al. gave results of little utility.

P-implantations in germanium at 25 kV to the extent of $10^{13}$–$10^{16}/cm^2$ were reported by G. S. Hubbard et al. in IEEE Trans. Nucl. Sci. NS-24, Nr. 1 (1977) P. 161, where the layer implanted at $10^{13}/cm^2$ was designated as inactive.

The assignee of the present application itself reported experiments in IEEE Trans. Nucl. Sci. NS-24, Nr. 1 (1777) P. 65, regarding semiconductor detectors that were obtained by boron implantation at 20 KV and $10^{14}/cm^2$ without annealing, as well as by phosphorus implantation at 20 kV and $10^{14}/cm^2$, with annealing at 400° C. In the frame of these experiments, it was also found that a diode 4 mm thick produced by phosphorus implantation at 20 kV and $10^{13}/cm^2$ and boron implantation for the p+ contact could be operated at a voltage of up to 2,300 V the dead layer of the p+ contact being reduced to 0.13 μm.

In spite of considerable development work, such semiconductor detectors have not yet, however, become accepted for general use, particularly because evident difficulties regarding the reliable and reproducible production of n+ contacts stable at high voltage.

SUMMARY OF THE INVENTION

It is an object of the present invention to provide phosphorus-implanted germanium detectors with improved properties capable of being produced by a reliable preparation process. Briefly, it has been discovered by the present invention that phosphorus implanted detectors of improved properties operable up to field intensities of more than 2500 V/cm can be obtained if the n+ contact is produced by phosphorus implantation of a relatively small dose and higher energy under a high vacuum and at room temperature and preferably combined with a further phosphorus implantation doping by a step operating at higher dose, but lower energy. The P-doping is followed by an annealing of at least 300° C. and preferably at 400° C. for a period of time which depends upon the annealing temperature for example amounting to 30 minutes at 400° C.

The semiconductor detectors so produced according to the invention are distinguished by their phosphorus implantation at the smallest possible dose, below $10^{14}$ ions per $cm^2$ and high energy of at least 25 kV, together with a second phosphorus implantation with at most 20 kV energy level and a dose of at least $10^{14}$ ions per $cm^2$.

Quite generally the (first) phosphorus implantation at small dose should be carried out at an energy level so high that an n+ doping is obtained at a sufficiently (relatively) flat character extending as far as possible into the substrate material, while at the same time an excessively strong spreading of the dead layer should be nevertheless avoided. Accordingly, the first implantation is preferably produced with energies above 25 kV up to about 40 kV and preferably with doses of about $10^{13}$ ions/$cm^2$. A phosphorus concentration ($cm^{-3}$) which is at least $10^3$ times as high as that of the substrate material could be regarded as a lower limit for the first implantation.

A surface barrier layer (vapor deposited metal) can be provided as the p+ contact, but preferably a p+ contact produced by boron implantation is chosen, preferably produced in the manner in itself already known at about 20 kV and $10^{14}$ ions/$cm^2$.

The detectors produced in accordance with the invention prove to be relatively stable with respect to voltage and durable. It can be inferred that the reason therefor is that the first implantation at higher energy and small dose extending farther into the semiconductor substrate material leaves a lattice structure that is to a great extent healed by annealing, if the phosphorus is implantated at room temperature under a high vacuum. The second implantation at higher dose and lower energy useful for the n+ contact production is regarded as reducing the surface resistance. The lattice deformations (amorphorphous layer) produced in a flat region under the surface of the detector can, indeed, be healed only with difficulty by annealing, but do not impair the function of the n+ contact.

BRIEF DESCRIPTION OF THE DRAWINGS

The invention is further described by way of illustrative example with reference to the annexed drawings, in which:

FIG. 1 shows by the arrows 1 the particle beam coming from the left and passing, with energy loss, through the detector 2 which is implanted on both sides as described in the example given below and is mounted between two metal rings 3.

FIG. 2 is a detail of a contact showing the implantation profile 4 below the horizontal dot dash line with the more closely spaced vertical lines indicating greater concentration of implanted ions, and also the resulting "dead zone" 5 in the part of the diagram above the dash-dot line.

EXAMPLE

Figure 1:
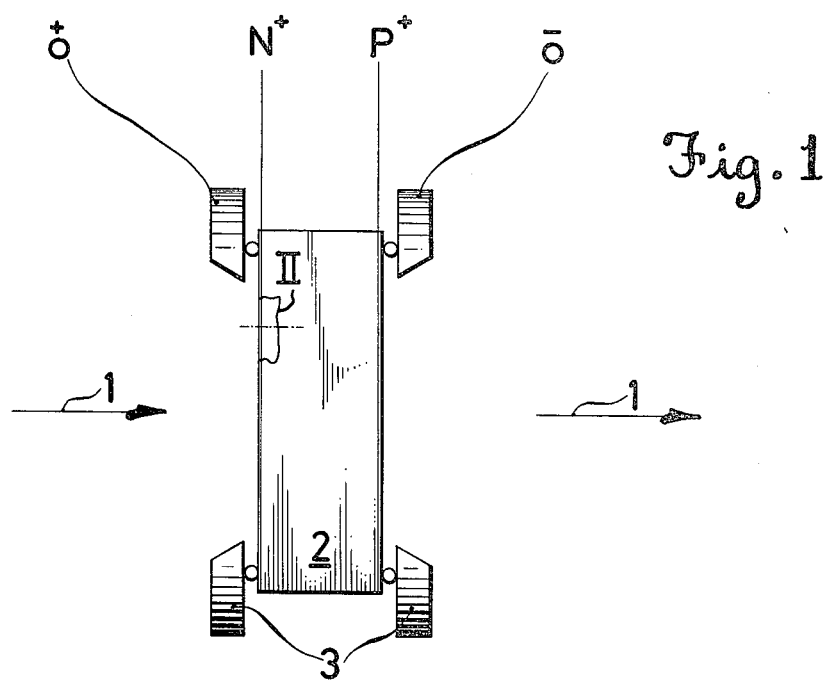
FIG. 1 is a diagram of a mounted transmission detector of highly pure germanium as used as a ΔE detector in charged particle spectrometry.
Figure 2:
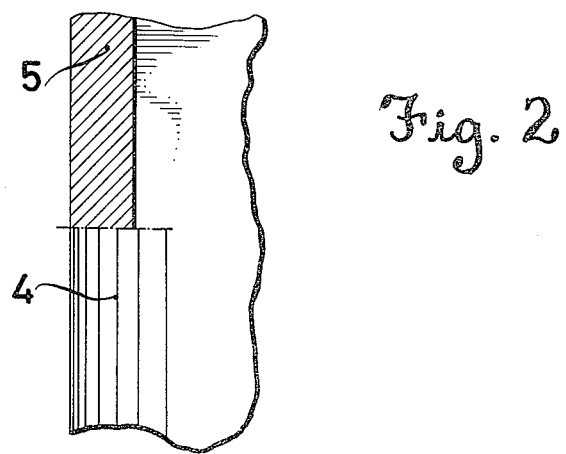
FIG. 2 is an enlarged cross-section of the portion II of the detector designated in FIG. 1.

Starting with pure germanium having an effective impurity concentration of $1.5 \cdot 10^{10}$ $cm^{-3}$, ten diodes with surface areas of 200–300 mm$^2$ and thicknesses of 3 to 4 mm and two rectangular diodes of 30×95×10 mm$^3$, as well as more than ten detectors with thicknesses between 2 and 16 mm and a diameter of about 40 mm were produced.

All n+ contacts were produced by phosphorus implantation at room temperature, with energy of 25–40 kV and dose of 10$^{13}$/cm$^2$, followed by annealing at 400° C. The p+ contacts were produced by boron implantation at room temperature with 20 kV energy and 10$^{14}$/cm$^2$ dose, without annealing. The large surface diodes were in a few cases provided a second phosphorus implantation at higher dose and lower energy (10–20 kV and 3·10$^{14}$/cm$^2$) or were provided with metal contacts by vapor deposition of aluminum or nickel or by ion-sputtering with nickel.

All of the detectors produced in the above-described manner could be operated up to high overvoltages—in most cases with more than 1000 V. By overvoltages values are meant at which the voltage necessary for complete depletion of the diode is exceeded. High field strengths then also are provided at the back contact (for example the p+ contact for a p-type substrate), that lead to a reduction of the "dead zones." The thickness of these "dead zones" is, according to our measurements, on both sides, below 0.3 μm. Hence, these detectors can be used as true transmission detectors.

According to the technologies heretofore known, for example "Hubbard et al.", it was not thought to be possible to produce detectors that could be operated up to voltages of the levels described above, while having such small "dead zones" on both contact sides.

Although the invention has been described with reference to a particular example of structure and operation, it will be understood that variations and modifications are possible within the inventive concept.

The energy of the first dose is preferably in the range between 25 and 40 kV, but still higher energy levels may be used with good results, up to 100 kV.

The second phosphorus implantation, although in general at an energy level not higher than 20 kV, is preferably at 10 kV and may be as low as 2–3 kV, while the dose, which should be at least 10$^{14}$ ions/cm$^2$ is preferably at 3·10$^{14}$ ions/cm$^2$ and may be as high as several 10$^{15}$ ions/cm$^2$.

We claim:

1. A semiconductor nuclear radiation detector of the PIN diode type operable up to field intensities of more than 2500 V per cm, comprising a body of high-purity germanium and an n+ contact region produced therein by a first high energy implantation doping with phosphorus ions of an energy of at least 25 kV at a dose magnitude below 10$^{14}$ ions/cm$^2$ followed by a second implantation of phosphorus ions of a dose of at least 10$^{14}$ ions/cm$^2$ and of an energy level not exceeding 20 kV, said body having an annealed lattice structure at least in the deep zones of high energy implantation, and the phosphorus concentration in the region of said first implantation being at least 10$^3$ times as high as that of the substrate material.

2. A semiconductor detector as defined in claim 1 in which said first phosphorus implantation is of an energy level between 25 and about 40 kV and of a dose of about 10$^{13}$ ions/cm$^2$.

3. A semiconductor detector as defined in claim 1, or 2 in which a p+ contact region is provided in said body by boron ion implantation.

4. A semiconductor detector as defined in claim 3 in which said boron implantation is provided by a dose of about 10$^{14}$ ions/cm$^2$ of an ion energy level of about 20 kV.

5. A semiconductor detector as defined in claim 3 which has "dead zones" on both sides, which zones each have a thickness less than 0.5 μm.

6. A method of making a durable and voltage-withstanding n+ contact region on the surface of a body of high-purity germanium for enabling said body to be usable in charged particle spectroscopy which comprises the steps of:

first subjecting said body to phosphorus ion implantation of a dose less than 10$^{14}$ ions/cm$^2$ at an energy level of at least 25 kV; and then subjecting said body to phosphorus ion implantation at an energy level below 20 kV and of a dose exceeding 10$^{14}$ ions/cm$^2$, followed by annealing at a temperature of at least 300° C.

7. Method as defined in claim 6 in which said first ion implantation step is of a dose of about 10$^{13}$ ions/cm$^2$ and of an energy level between 25 and 40 kV.

8. Method as defined in claim 6 or 7 in which said first ion implantation step is of a dose which is as small as practically possible for producing a phosphorus concentration at least 10$^3$ as high as that of the substrate material.

9. Method as defined in claim 6 or 7 in which said annealing is performed at about 400° C.

* * * * *